(12) United States Patent
Melanson

(10) Patent No.: US 7,903,010 B1
(45) Date of Patent: Mar. 8, 2011

(54) DELTA-SIGMA ANALOG-TO-DIGITAL CONVERTER (ADC) HAVING A SERIALIZED QUANTIZER OUTPUT

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 31 days.

(21) Appl. No.: 12/551,198

(22) Filed: Aug. 31, 2009

(51) Int. Cl.
*H03M 3/00* (2006.01)

(52) U.S. Cl. ............................ 341/143; 341/76; 341/155

(58) Field of Classification Search ............... 341/76, 341/77, 100, 101, 143, 155
See application file for complete search history.

(56) References Cited

U.S. PATENT DOCUMENTS

| | | | |
|---|---|---|---|
| 4,099,122 A | 7/1978 | van Buul | |
| 4,438,522 A * | 3/1984 | Bluethgen | 341/143 |
| 4,882,585 A * | 11/1989 | Beard | 341/143 |
| 5,091,945 A * | 2/1992 | Kleijn | 704/219 |
| 5,357,252 A | 10/1994 | Ledzius et al. | |
| 5,471,209 A | 11/1995 | Sutterlin et al. | |
| 5,959,562 A | 9/1999 | Wiesbauer | |
| 5,977,899 A | 11/1999 | Adams | |
| 5,982,316 A | 11/1999 | Shin | |
| 6,201,835 B1 | 3/2001 | Wang | |
| 6,473,019 B1 | 10/2002 | Ruha et al. | |
| 6,546,515 B1 * | 4/2003 | Vary et al. | 714/746 |
| 6,608,581 B1 | 8/2003 | Semenov | |
| 6,670,902 B1 | 12/2003 | Melanson et al. | |
| 6,674,381 B1 | 1/2004 | Gomez et al. | |
| 6,744,392 B2 | 6/2004 | Melanson | |
| 6,819,723 B1 | 11/2004 | Wu et al. | |
| 6,873,276 B2 | 3/2005 | Yang et al. | |
| 6,956,514 B1 | 10/2005 | Melanson et al. | |
| 7,298,395 B2 | 11/2007 | Fukaya et al. | |
| 7,423,567 B2 | 9/2008 | Melanson | |
| 2001/0044713 A1 * | 11/2001 | Lokhoff et al. | 704/201 |
| 2002/0021238 A1 | 2/2002 | Noro et al. | |
| 2004/0032355 A1 | 2/2004 | Melanson | |
| 2004/0036634 A1 | 2/2004 | Level et al. | |
| 2005/0012649 A1 | 1/2005 | Adams et al. | |
| 2005/0184895 A1 | 8/2005 | Petersen et al. | |
| 2010/0046641 A1 * | 2/2010 | Wala | 375/241 |

* cited by examiner

*Primary Examiner* — Howard Williams
(74) *Attorney, Agent, or Firm* — Andrew M. Harris; Mitch Harris, Atty at Law, LLC

(57) ABSTRACT

A delta-sigma analog-to-digital converter (ADC) having a serialized quantizer output has a data rate greater than a quantization rate of the delta-sigma modulator, but less than a bit rate determined by the product of the number of bits required to represent the input to a feedback digital-to-analog converter and the quantization rate. Additional information can be encoded in the serial bit stream by selection among redundant codes based on the value of the additional information. The serial bit stream may encode differences between successive quantizer output samples and the additional information may include the absolute value of the quantizer output, synchronization information and/or framing information for distinguishing data corresponding to multiple ADC input channels.

29 Claims, 4 Drawing Sheets

DELTA-SIGMA ANALOG-TO-DIGITAL CONVERTER (ADC) HAVING A SERIALIZED QUANTIZER OUTPUT

BACKGROUND OF THE INVENTION

1. Field of the Invention

The present invention relates generally to analog-to-digital converters, and more specifically, to an analog-to-digital converter having a serialized quantizer output.

2. Background of the Invention

Delta-sigma analog-to-digital converters (ADCs) are in widespread use in consumer and industrial devices. Delta-sigma ADCs provide a very linear response and control of quantization noise. The relative simplicity of the architecture and the ability to finely control the quantization noise makes delta-sigma converter implementations very desirable. The delta-sigma modulator based analog-to-digital converter includes a loop filter that receives an input signal and a quantizer that converts the output of the loop filter to a digital representation. Feedback from the quantizer output is applied to the loop filter in feedback modulator topologies or is summed with the output of the loop filter in feed-forward modulator topologies to provide a closed-loop that causes the time-average value of the output of the quantizer to accurately represent the value of the modulator input signal. The loop filter provides shaping of the quantization noise at the output of the quantizer in response to the feedback signal applied from the quantizer to the loop filter. The feedback provided from the quantizer is typically generated by a coarse feedback DAC that receives the digital output of the quantizer and generates an analog value that is provided to the loop filter or the output summer.

The output of the delta-sigma ADC is generally the output of a decimation filter that is provided at a rate substantially lower than the quantization rate of the quantizer. The output decimated samples are usually provided in either a parallel or serial form. However, the input to the decimation filter, which is the output of the quantizer, is typically provided in a parallel form if the output of the quantizer has more than two levels. Since a typical quantizer may have, for example, seventeen levels, a serial bit stream at five times the quantization rate would be required to transfer the quantizer output using a typical serial interface. In some applications, for example in isolated circuits such as transformer-coupled or optically-isolated circuits, it is desirable to couple the quantizer output using a serial interface in order to transfer the data from the quantizer output to the serial interface over a single channel. However, the increased data rate required in an ADC having a number of quantizer levels greater than two comes with increased power requirements, increased component bandwidth requirements and higher generated levels of electromagnetic interference (EMI) due to the higher bit rates required.

Therefore, it would be desirable to provide a delta sigma ADC that has a serialized quantizer output without requiring a high serial data rate.

SUMMARY OF THE INVENTION

The above stated objective of providing a delta sigma ADC with a serialized quantizer output is achieved in an analog-to-digital converter circuit and its method of operation.

The analog-to-digital converter includes a loop filter that provides an output to a quantizer input. The output of the quantizer provides the output of a delta-sigma modulator and is converted using a digital-to-analog converter to provide a feedback signal to the loop filter. The output of the quantizer is coupled to a serial data circuit that serializes the output of the quantizer to produce a serial bit stream at a data rate that is higher than the quantization rate, but lower than the quantization rate multiplied by the number of bits required to represent the input to the digital-to-analog converter.

Additional information may be encoded in the selection among redundant codes provided in the serial bit stream and the output of the quantizer may be encoded as differences so that as few as two bits are required to represent the quantizer output, while providing two redundant codes that can be used to encode other information such as synchronization information, framing information (especially among multiple ADC channels) and an absolute value of the output of the ADC.

In a particular embodiment, the output of the quantizer may be provided to a digital integrator. A difference circuit generates a difference between a present value and a previous value if the output of the digital integrator provides a feedback signal to the loop filter, which may include a summing circuit for combining the feedback with a plurality of feed-forward signals provided from the loop filter. The output of the difference circuit is encoded in the serial bit stream, and the output of the digital integrator is then encoded in the selection of the redundant codes at a lower rate in order to provide the absolute output value of the ADC at the remote end of a serial interface that receives the serial bit stream.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a delta-sigma analog-to-digital converter (ADC) method and apparatus having a serialized quantizer output. The serial output provides for cost effective and simple isolation through a transformer, optical coupler, or capacitive coupling mechanism. The serial data output of the ADC of the present invention has a bit rate that is greater than the quantization rate, but less than a rate determined by the number of bits required to represent the output of the quantizer multiplied by the quantization rate. In other words, the ratio of the bit rate of the ADC output to the quantization rate is greater than unity, but less than the number of bits required to represent the output of the quantizer. Additional information such as synchronization for the samples and synchronization of a rotating pattern of multiple channels of data can be encoded in the bit stream by selecting among multiple redundant codes for one or more values of the quantizer output, which may be delta (difference) encoded. If the quantizer output is delta encoded, the additional information may include an absolute value of the quantizer output, so that the startup value can be determined from the absolute value and subsequent changes received at the remote side of the interface and any error due to a missed or erroneous transmission can be corrected.

Figure 1:
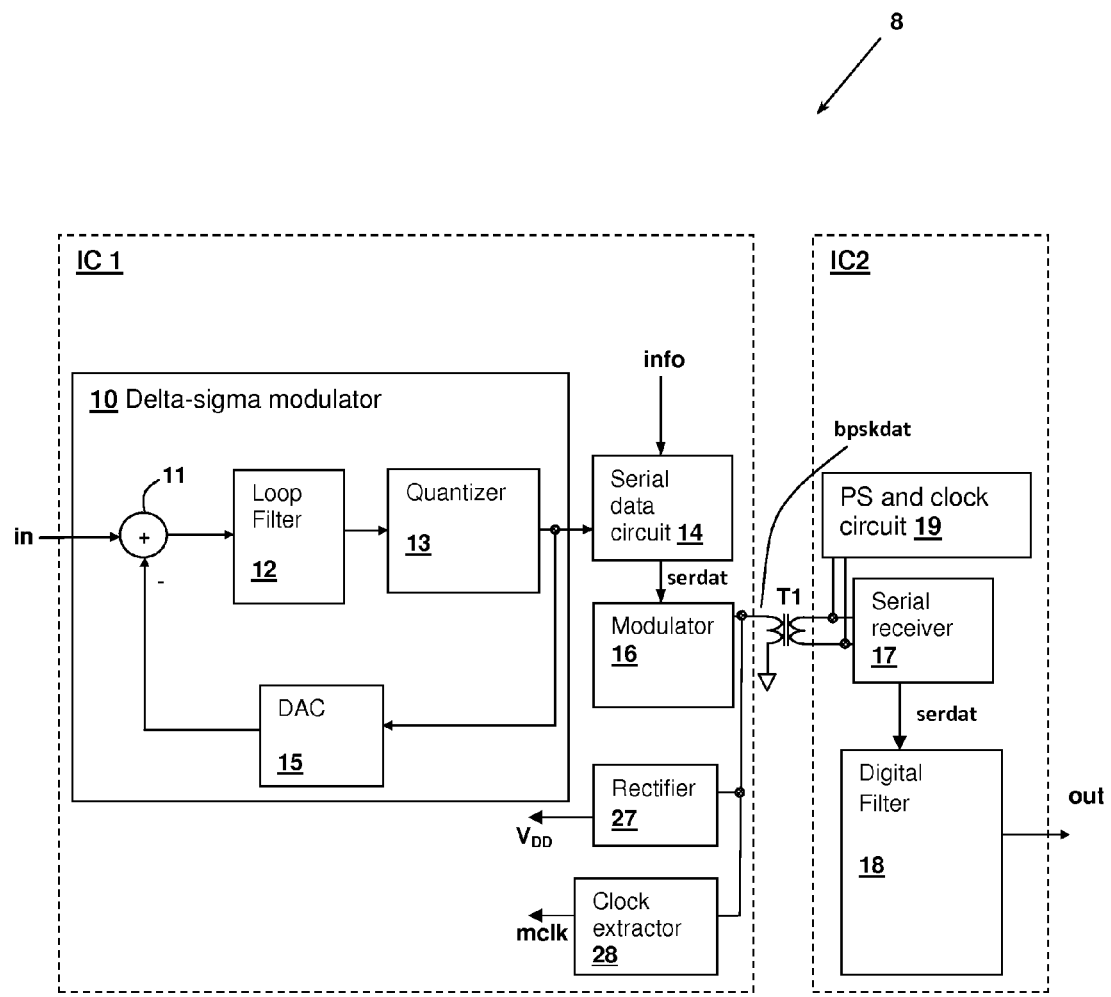
FIG. 1 is a block diagram depicting a delta-sigma ADC in accordance with an embodiment of the present invention.

Referring now to FIG. 1, a delta-sigma analog-to-digital converter (ADC) circuit 8, in accordance with an embodiment of the present invention, is shown. A delta-sigma modulator 10 formed by a summer 11, a loop filter 12 that noise-shapes the output of summer 11, a quantizer 13 that converts the output of loop filter 12 to a digital value, and a digital-to-analog converter (DAC) 15 that provides a feedback signal to summer 11. The time average of the output of quantizer 13 represents the value of the voltage of input signal in. A serial data circuit 14 converts the output of quantizer 13 to a serial bit stream serdat, and a modulator 16 may modulate serial bit stream serdat generated by serial data circuit 14 for transmission through transformer T1. In the depicted exemplary embodiment, the above described circuitry is contained within a first integrated circuit IC1 which is coupled to a second integrated circuit IC2 by transformer T1. Second integrated circuit IC2 contains a serial receiver circuit 17 that receives modulated serial bitstream bpskdat, performs error checking and synchronization, and reconstructs serial bit stream serdat. Second integrated circuit IC2 may also include a power supply and clock circuit 19 that superimposes or otherwise multiplexes a waveform carrying power and/or clock information on transformer T1. First integrated circuit IC1 includes a rectifier circuit 27 for obtaining power supply voltage $V_{DD}$ from the superimposed power waveform for operating first integrated circuit IC1 and a clock extractor circuit 28 that generates a master clock mclk for operating quantizer 13, serial data circuit 14 and modulator 16. The output of serial receiver circuit 17 is provided to a digital filter 18, which produces ADC samples at output out from a much larger number of quantizer output values reconstructed by serial receiver circuit 17 from serial bit stream serdat. The serial bit stream generated by serial data circuit 14 not only transforms the output of quantizer 13 to serial bit stream serdat, but also encodes additional information info in serial bit stream serdat. Additional information info is embedded by selecting among redundant codes, an example of which is illustrated below in Table I.

TABLE I

| Code | Quantizer output | info bit |
|------|------------------|----------|
| 000  | −3               | —        |
| 001  | −2               | —        |
| 010  | −1               | —        |
| 011  | 0                | 0        |
| 100  | 0                | 1        |
| 101  | +1               | —        |
| 110  | +2               | —        |
| 111  | +3               | —        |

As illustrated in Table I, in the depicted embodiment, the output of quantizer 13 has seven unique numeric values {−3, −2, −1, 0, 1, 2, 3}, but the three bits required to represent the output of quantizer 13 in binary form are capable of representing eight values. So, a redundant pair of codes can be assigned to one particular quantizer output level, which in the example are assigned to a value of 0 at the output of quantizer 13. Therefore, when the output of quantizer 13 is 0, a bit of additional information info can be passed through transformer T1.

The transfer rate of additional information info is dependent on the pattern of values at the output of quantizer 13, since additional information info can only be transmitted when the value of the output of quantizer 13 is 0 in the illustrated encoding scheme, since 0 is the only value for which selection between multiple redundant codes can be made in order to encode the extra information. However, the transfer rate is sufficient for certain types of information, such as synchronization information and error correcting information that does not require a high transmission rate. Further, depending on the characteristics of input signal in and the response of loop filter 12, the quantizer output value(s) chosen for assignment to redundant codes can be a more frequent value than other values. For example, in the embodiment illustrated in Table I, the zero code may be generated by more than 50% of samples, statistically, yielding an average bit rate of additional information info of at least ⅙ of the bit rate of the serial bit stream transmitted through transformer T1.

Figure 2:
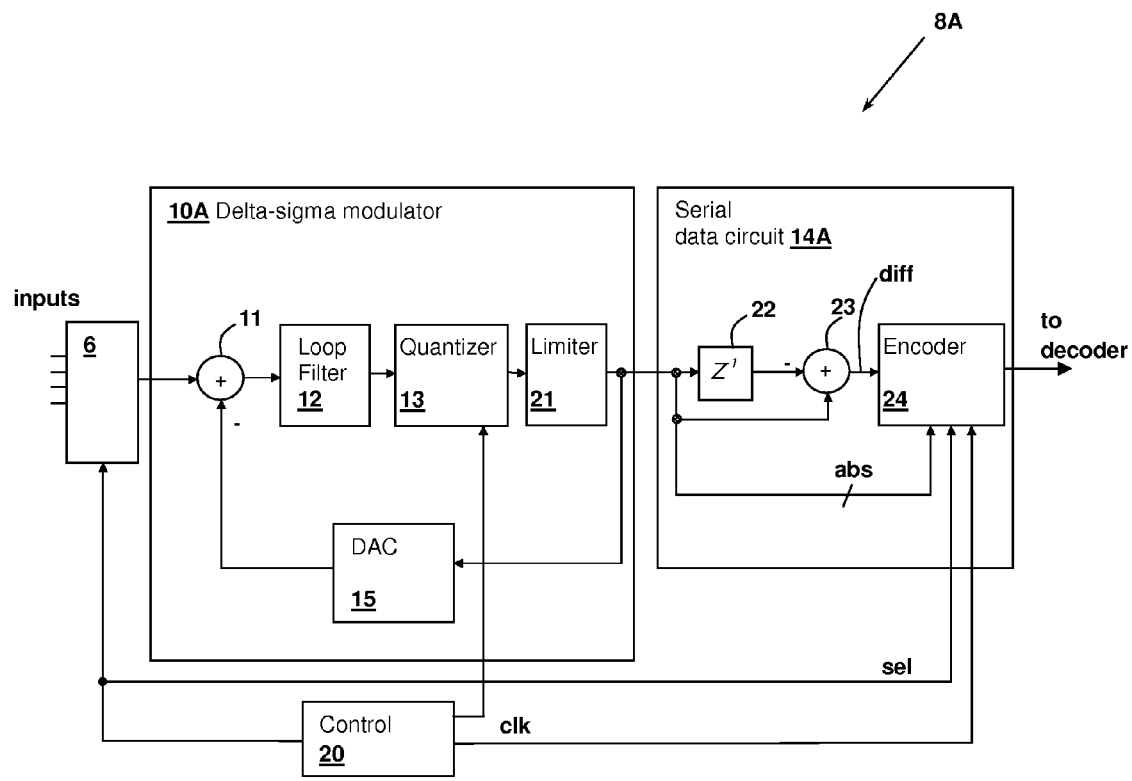
FIG. 2 is a block diagram depicting a delta-sigma ADC in accordance with another embodiment of the present invention.

Referring now to FIG. 2, a delta-sigma ADC 8A in accordance with another embodiment of the invention is shown. ADC 8A of FIG. 2 is similar to ADC 8 of FIG. 1, so only differences between them will be described below. A multiplexer 6 is included to select between multiple input signals in response to a selection value sel provided by a control circuit 20, which may be for example, a microprocessor or state machine that manages the sampling of multiple input channels. Selection value sel may determine all or part of the additional information info and multiplexer 6 and control circuit 20 may also be included in the ADC of FIG. 1, but for the purposes of illustration, additional information info encoded by a serial data circuit 14A will include framing information corresponding to selection value sel, as well as synchronization information indicating the location of the first bit of each serial value transmitted by serial data circuit 14A, and an absolute value abs of the output of a limiter 21 included within delta-sigma modulator 10A, which will be described in further detail below.

Limiter 21 receives the output of quantizer 13 and limits changes in the output codes generated by quantizer 13, so that the difference between successive quantizer values can only be an increment (+1), a decrement (−1), or no change (0). A difference circuit, formed by unit delay 22 and subtractor 23 provides a serial bitstream diff, that encodes differences between the quantizer output values, and serial data circuit 14A encodes the output of subtractor 23 in a two-bit serial bitstream as depicted in Table II below.

TABLE II

| Code | Quantizer output | info bit |
|------|------------------|----------|
| 00   | −1               | —        |
| 01   | 0                | 0        |
| 10   | 0                | 1        |
| 11   | +1               | —        |

Each time the output of quantizer 13 does not change, an extra bit of additional information is transmitted, which encodes the state of selection signal sel, a synchronization pattern that allows for recovery of the pattern alignment, which may be inherent in the coding of the additional information, and the absolute value abs of the output of limiter 21. Absolute value as used in the present application indicates the full value of the output of limiter 21, which may be signed or unsigned.

Figure 3:
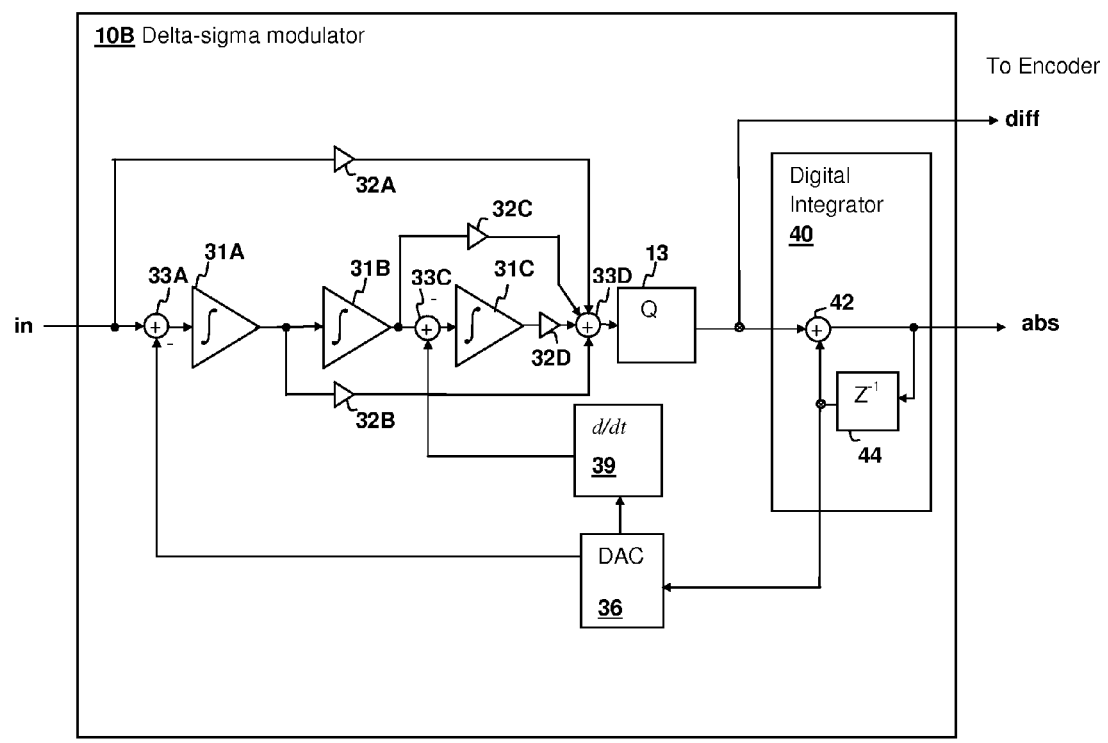
FIG. 3 is a block diagram depicting a delta-sigma modulator that can be used in the ADC of FIG. 2 in accordance with an embodiment of the present invention.

Referring now to FIG. 3, a delta-sigma modulator 10B with a topology in accordance with an embodiment of the present invention is shown. Delta-sigma modulator 10B receives input in and provides a noise-shaped output abs. In delta-sigma modulator 10B, output abs is provided from a digital integrator 40 that integrates the output of quantizer 13 that quantizes the output of the loop filter. Digital integrator includes a storage device, delay 44 that stores a previous value of the output of digital integrator 40 and an adder 42 that adds the present value of digital integrator 40 to the stored previous value, forming an accumulator. Output abs of adder 42 is serialized as a serial bit stream, transmitted, received and provided to a low-pass filter, e.g. as in ADC 8 of FIG. 1.

In order to account for the action of digital integrator 40, a portion of the feedback signal applied to the loop filter is differentiated by a differencing circuit. In the depicted embodiment, the differencing circuit is provided by a differentiator 39 that receives an input from a DAC 36 and applied to a summer 33C that provides the input to the final integrator stage 31C. DAC 36 receives the output of storage device 44. Another feedback path that is necessary for the converter to provide the correct DC and low-frequency output from the converter corresponding to the voltage of signal IN, is provided directly from DAC 36.

In FIG. 3, a loop filter is implemented by a series of analog integrator stages 31A-31C that each receive an input signal from the previous stage. Input summers 33A and 33C provide for combining feedback signals with the other inputs of the first and third integrator stages 31A and 31C, respectively. The output of integrator 31C is combined by a summer 33D with feed-forward signals scaled by scaling circuits 32A-32D, provided from input signal in and the outputs of integrator stages 31A-C, respectively. The output of summer 33D provides the input to quantizer 13. The resulting filter is a third-order filter with four tunable feed-forward paths. Combiners 33A and 33C-33D may be summing amplifiers, and scaling circuits 32A-D may be resistors that set the gain of the summing amplifier with respect to the output of each integrator 31A-31C. Alternatively, for switched-capacitor implementations, scaling circuits 32A-32D will generally be the input charge-transfer capacitors and associated switching circuits. The depicted delta-sigma modulator is described in further detail and in alternative embodiments in U.S. Pat. No. 7,423,567, issued Sep. 19, 2008 to the Applicant, and which is incorporated herein by reference. The delta-sigma modulator techniques described in the above-referenced U.S. Patent are particularly useful in the context of the present invention, as the reduced number of quantizer output levels produced by the delta-sigma modulators disclosed therein can provide for serialization of the output of the quantizer with a small number of codes required. The resulting reduction in required codes enables assignment of one or more redundant codes to provide encoding of additional information in accordance with the techniques of the present invention.

Figure 4:
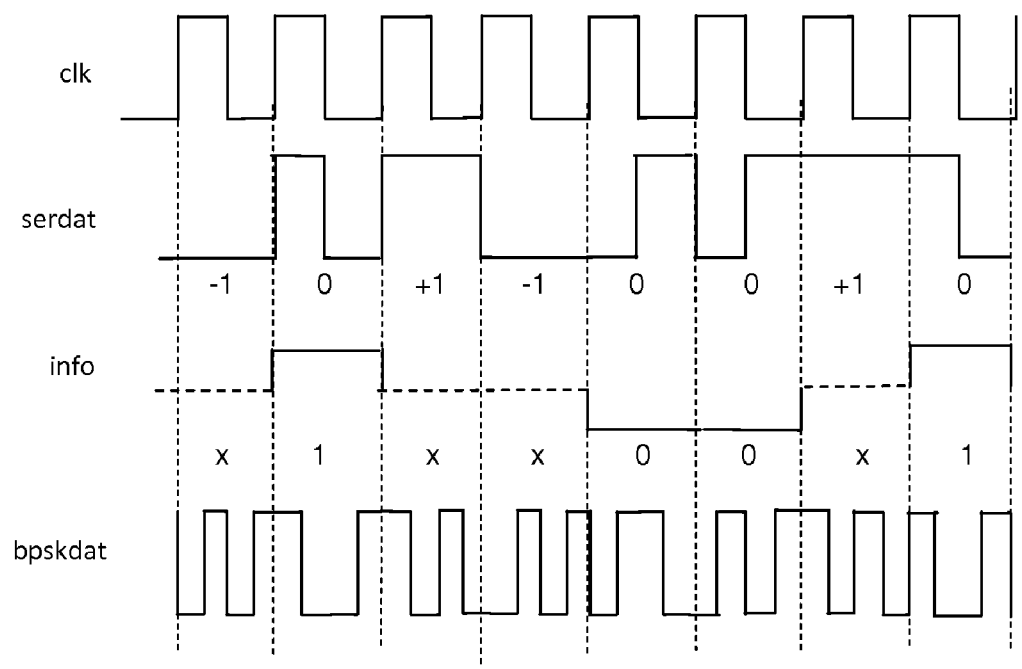
FIG. 4 is a timing diagram showing waveforms within the ADC converters of FIG. 1 and FIG. 2.

Referring now to FIG. 4, a timing diagram depicting signals within the ADC circuit 8A of FIG. 2 is shown. Clock signal clk illustrates the quantization (sampling) period of delta-sigma modulator 10A and serial bit stream serdat provided from the output of serial data circuit 14 is shown, encoding output diff of subtractor 23 with codes as shown in Table I with most significant bit (MSB) first. Additional information info is labeled below with an "x" and has a dashed line in the corresponding waveform in intervals during which additional information info is not present, and illustrated as having binary values 1 or 0 in intervals during which valid additional information info is present (i.e., when serial bit stream serdat is encoding "no change" or 0). Signal bpskdat is an illustrative output of modulator 16 showing bipolar phase-shift keying modulation, but it is understood that any suitable modulation technique such as frequency modulation (FM) or modified FM (MFM) may be used. Generally, suitable modulation techniques for transfer of signals through transformers, such as transformer T1 of FIG. 1, are those having a zero net DC value, and unmodulated serialized outputs of quantizers in delta-sigma modulators of the present invention may also be used if the encoding is such that a net DC value is avoided in a long-term average of the serial bitstream.

Another encoding level as between the bits of additional information info, will generally be employed in order to synchronize the transmission of the additional information. For example, a marker can be generated by a succession of the same state of additional information info, such as two successive ones followed by a zero: "110". Occurrence of the marker can provide synchronization information, and the codes between the markers can provide other information such as the absolute value abs of the quantizer output and channel framing information. For example if a sequence such as 110001100110010110100 . . . is generated in additional information info and is interpreted as M00M0M0010M0M00, where M is a marker, if the number of bits between each marker M is limited to five (or the number of codes starting with a zero is limited to 6 between successive "11" occurrences), then 18 codes are available, which can for example, encode 17 absolute quantizer levels and one extra code for indicating that other information follows in a next code, such as a channel number.

Table III illustrates an encoding scheme in which the coding scheme stated above is followed. The leading zero and the trailing "11" are included in the codes, so that each code includes a start bit "0" and a stop marker "11." The unique (data-bearing) portion of each code is shown in bold. The codes shown in Table III are codes transmitted via the selection among redundant codes for the quantizer output difference information, such as codes "01" and "10" of Table II. Therefore, the Codes shown in column 1 of Table III are not bit sequences in serial bitstream serdat, but rather occurrences of the different redundant codes that indicate "0" and "1". Further, as described above, the rate of transmission of the bits forming the codes illustrated in Table III varies with the occurrence of the codes in the quantizer difference information for which redundant code selection is possible. Therefore, the data rate of the information transmitted via the codes of Table III varies not only with the length of the code, but with the pattern of the difference information being generated by the quantizer at any given time. However, a constant average bit rate for the bits of the codes shown in Table III can be assumed, as the statistical likelihood of the difference values assigned to redundant codes should be relatively constant under normal operating conditions of the ADC.

TABLE III

| Code | Data Type | Value |
| --- | --- | --- |
| 01001011 | Absolute Q value abs | 0 |
| 0101011 | Absolute Q value abs | 1 |
| 01010011 | Absolute Q value abs | 2 |
| 0001011 | Absolute Q value abs | 3 |
| 00010011 | Absolute Q value abs | 4 |
| 00001011 | Absolute Q value abs | 5 |
| 010011 | Absolute Q value abs | 6 |
| 00100011 | Absolute Q value abs | 7 |
| 001011 | Absolute Q value abs | 8 |
| 01000011 | Absolute Q value abs | 9 |
| 010011 | Absolute Q value abs | 10 |
| 0100011 | Absolute Q value abs | 11 |
| 01011 | Absolute Q value abs | 12 |
| 0000011 | Absolute Q value abs | 13 |
| 000011 | Absolute Q value abs | 14 |
| 00011 | Absolute Q value abs | 15 |
| 0011 | Absolute Q value abs | 16 |
| 011 | Channel zero sel | — |

The first seventeen codes encode the absolute value of the quantizer at the time when the start bit is transmitted. When the receiver receives the full code, the cumulative value of the quantizer differences that have been received since the start bit was received are added to the received absolute quantizer offset value abs to determine the offset of the quantizer value at the receiver. After the initial absolute quantizer offset value abs, any differences between the computed value of quantizer offset value abs from a newly received code and the current absolute offset value at the receiver is an indication that a transmission error has occurred at some time and an indication of channel quality can be generated from the number of detected errors. The last code in Table III, NULL code 011, provides framing for multiple-channel ADCs and is emitted when the next code corresponds to channel 0. After the channel zero code, the channel values rotate from sample to sample, both in the top-level encoding of the quantizer difference output diff, and in the sub-code encoding of the absolute quantizer offset value abs via selection between the redundant difference codes.

While the invention has been particularly shown and described with reference to the preferred embodiments thereof, it will be understood by those skilled in the art that the foregoing and other changes in form and details may be made therein without departing from the spirit and scope of the invention.

What is claimed:

1. An analog-to-digital converter, comprising:
a noise-shaping filter having an input for receiving an analog signal to be converted to a digital value;
a quantizer having an input coupled to an output of the noise-shaping filter for generating quantized output values at a quantization rate of the quantizer, wherein the quantized output values are from a set of more than two output values;
a digital-to-analog converter having an input for receiving the quantized output values and having an output coupled to an input of the noise-shaping filter for providing a feedback signal, wherein the noise-shaping filter, the quantizer and the digital-to-analog converter form a delta-sigma modulator loop; and
a serial data circuit having an input coupled to an output of the quantizer for generating a serial bit stream representing the quantized output values, wherein a ratio of the bit rate of the serial bit stream to the quantization rate of the quantizer is greater than unity but less than a minimum number of bits required to represent the input of the digital-to-analog converter.

2. The analog-to-digital converter of claim 1, wherein the serial data circuit generates the serial bit stream to encode differences between sequential values of the output of the quantizer at the quantization rate of the quantizer.

3. The analog-to-digital converter of claim 1, wherein the quantizer generates constrained output values such that the serial data circuit encodes the bitstream to represent the quantized output values with a set of codes smaller than the number of codes available in the serial bit stream, whereby additional information is embedded in the serial bit stream by selection among two or more redundant codes both indicating a same next quantized output value, but different values for the additional information.

4. The analog-to-digital converter of claim 3, wherein the serial data circuit generates the serial bit stream to encode differences between sequential values of the output of the quantizer at the quantization rate of the quantizer and wherein the serial bit stream encodes the additional information including an indication of an absolute level of the output of the quantizer encoded over multiple frames of the serial bit stream.

5. The analog-to-digital converter of claim 3, wherein the serial bit stream encodes the additional information including synchronization information indicating the position of frames of the quantized output values within the serial bit stream.

6. The analog-to-digital converter of claim 3, wherein the quantizer is a first quantizer, wherein the quantized output values are first quantized output values, wherein the analog-to-digital converter includes a second delta-sigma modulator loop generating an output from a second quantizer, and having a second input provided to a second noise-shaping filter of the second delta-sigma modulator loop, wherein the serial bit stream encodes the first and the second quantized output values, and wherein the serial bit stream further encodes the additional information including a framing indication for indicating whether a given quantized output value in the serial bit stream is one of the first quantized output values or one of the second quantized output values.

7. The analog-to-digital converter of claim 6, wherein the second quantized output values are generated at a second quantization rate that differs from the quantization rate of the first quantizer.

8. The analog-to-digital converter of claim 3, wherein the serial bit stream encodes a set of differences between sequential ones of the quantized output values including only a single bit increment, a single bit decrement, and no change, and wherein the serial bit stream encodes a first set of codes for each of the elements of the set of differences and a second code representing a particular element of the set of differences in addition to the corresponding particular one of first codes that represents the particular element, and wherein the serial data circuit encodes the additional information in a pattern formed by generation of the particular one of the first codes and the second codes when the value of the output of the quantizer is equal to the particular element of the set of differences.

9. The analog-to-digital converter of claim 1, wherein the serial bit stream is a two bit code generated at the quantization rate of the quantizer and representing three values of the output of the quantizer.

10. The analog-to-digital converter of claim 1, further comprising:
a transformer having a first winding coupled to an output of the serial data circuit; and
a decoder circuit having an input coupled to a second winding of the transformer, wherein the decoder circuit decodes the serial bit stream to obtain the quantized output values.

11. The analog-to-digital converter of claim 10, further comprising a power supply circuit for receiving at least one of a power supply voltage for operating the analog-to-digital converter or a clock signal for operating the quantizer from the first winding of the transformer.

12. The analog-to-digital converter of claim 1, further comprising a digital integrator having an input coupled to an output of the quantizer for integrating the quantized output values, wherein the feedback signal is provided from the output of the digital integrator.

13. The analog-to-digital converter of claim 12, wherein the quantizer generates constrained output values such that the serial data circuit encodes the differences with a set of codes smaller than the number of codes available in the serial bit stream, and wherein the serial data circuit further embeds a value of the output of the digital integrator in the serial bit stream by selection among two or more redundant codes both representing a particular output level of the quantizer.

14. An analog-to-digital converter, comprising:
a quantizer for generating a digital output from an analog input signal; and
an output encoder for generating a data output of the analog-to-digital converter from the digital output of the quantizer, wherein the data output represents changes in the digital output as a sequence of codes in the data output, and wherein the sequence of codes extends over a set of codes including at least one redundant code, whereby one value of the changes in the digital output is represented by at least two codes, and wherein a pattern of the at least two codes in the data output represents an indication of an absolute level of the digital output.

15. A decoder circuit for receiving and decoding a serial bit stream representing output values of an analog-to-digital conversion, the decoder circuit comprising:
a receiver for receiving the serial bit stream, wherein the serial bit stream encodes the output values of the analog-to-digital conversion along with additional information by using redundant codes to express at least one output level of the analog-to-digital conversion; and
a decoder for decoding the serial bit stream to obtain the output values, wherein the decoder checks a sequence of codes within the serial bit stream for error by examining a sequence of the redundant codes.

16. The decoder circuit of claim 15, wherein the serial bit stream encodes changes in an output of a quantizer that performs the analog-to-digital conversion, wherein the additional information represents an absolute level of the output of the quantizer, wherein the decoder further obtains the absolute level of the output of the quantizer from the serial bit stream.

17. The decoder circuit of claim 15, wherein the serial bit stream represents oversampled values of the analog-to-digital conversion and wherein the decoder circuit further comprises a decimation filter having an input coupled to an output of the decoder for generating an output from the oversampled values.

18. A method of operating an analog-to-digital converter, comprising:
filtering an input and feedback signals with an analog loop filter;
quantizing a result of the filtering to provide quantized output values;
providing feedback proportional to a result of the quantizing as an input to the filtering;
converting a result of the quantizing to a serial bit stream, wherein a ratio of the bit rate of the serial bit stream to a quantization rate of the quantizing is greater than unity but less than a minimum number of bits required to represent a set of possible values for the feedback provided by the providing.

19. The method of claim 18, wherein the converting generates the serial bit stream to encode differences between sequential values of the result of the quantizing at the quantization rate.

20. The method of claim 18, wherein the result of the quantizing is constrained such that the converting encodes the result of the quantizing with a set of codes smaller than the number of codes available in the serial bit stream, whereby additional information is embedded in the serial bit stream by selecting among two or more redundant codes both representing a same next result of the quantizing, but different values of the additional information.

21. The method of claim 20, wherein the converting generates the serial bit stream to encode differences between sequential values of the result of the quantizing at the quantization rate, and wherein the serial bit stream encodes the additional information including an indication of an absolute level of the result of the quantizing encoded over multiple frames of the serial bit stream.

22. The method of claim 20, wherein the converting encodes the serial bit stream with the additional information including synchronization information indicating the position of frames of values of the result of the quantizing within the serial bit stream.

23. The method of claim 20, wherein the quantizing is a first quantizing and further comprising:
second filtering second input and second feedback signals with another analog loop filter;
second quantizing a result of the second filtering to provide second quantized output values; and
providing another feedback signal proportional to a result of the second quantizing to as an input to the second filtering, and wherein the converting further encodes a result of the second quantizing along with the result of the first quantizing, and wherein the converting further encodes the additional information including a framing indication for indicating whether a given value in the serial bit stream is one of the result of the first quantizing or the result of the second quantizing.

24. The method of claim 23, wherein the quantization rate is a first quantization rate of the first quantizing, and wherein values of the result of the second quantizing are generated at a second quantization rate that differs from the first quantization rate.

25. The method of claim 20, wherein the serial bit stream encodes a set of differences between sequential values of the result of the quantizing including only a single bit increment, a single bit decrement, and no change, and wherein the serial bit stream encodes a first set of codes for each of the elements of the set of differences and a second code representing a particular element of the set of differences in addition to the corresponding particular one of first codes that represents the particular element, and wherein the serial data circuit encodes the additional information in a pattern formed by generation of the particular one of the first codes and the second codes when the result of the quantizing is equal to the particular element of the set of differences.

26. The method of claim 18, wherein the serial bit stream is a two bit code generated at the quantization rate of the quantizing and representing three values of the result of the quantizing.

27. The method of claim 18, further comprising:
coupling the serial bit stream through a transformer through a first winding of the transformer; and
decoding the serial bit stream from a signal received from a second winding of the transformer to obtain the quantized output values.

28. The method of claim 27, further comprising receiving at least one of a power supply voltage for powering the analog-to-digital converter or a clock signal for operating the analog-to-digital converter from the first winding of the transformer.

29. The method of claim 18, further comprising integrating a result of said quantizing with a digital integrator, and wherein the providing provides the feedback from a result of the integrating.

* * * * *